United States Patent [19]
Chan

[11] Patent Number: 6,046,085
[45] Date of Patent: Apr. 4, 2000

[54] ELIMINATION OF POLY STRINGERS WITH STRAIGHT POLY PROFILE

[75] Inventor: Maria Chow Chan, San Jose, Calif.

[73] Assignee: Advanced Micro Devices, Inc., Sunnyvale, Calif.

[21] Appl. No.: 08/986,951

[22] Filed: Dec. 8, 1997

[51] Int. Cl.⁷ .................................................. H01L 21/336
[52] U.S. Cl. .......................... 438/257; 438/259; 438/264; 216/67; 216/79
[58] Field of Search ........................ 216/67, 79; 438/257, 438/264, 259

[56] References Cited

U.S. PATENT DOCUMENTS

| | | | |
|---|---|---|---|
| 5,126,808 | 6/1992 | Montalvo et al. | 365/185.09 |
| 5,242,536 | 9/1993 | Schoenborn | 156/643 |
| 5,324,683 | 6/1994 | Fitch et al. | 438/422 |
| 5,342,801 | 8/1994 | Perry et al. | 438/588 |
| 5,414,287 | 5/1995 | Hong | 257/316 |
| 5,423,941 | 6/1995 | Komura | 156/643.1 |
| 5,427,967 | 6/1995 | Sadjadi et al. | 438/257 |
| 5,574,685 | 11/1996 | Hsu | 365/185.18 |
| 5,598,369 | 1/1997 | Chen et al. | 365/185.18 |
| 5,656,527 | 8/1997 | Choi | 423/258 |
| 5,656,533 | 8/1997 | Kim | 438/704 |
| 5,661,055 | 8/1997 | Hsu et al. | 438/259 |
| 5,668,034 | 9/1997 | Sery et al. | 438/266 |
| 5,696,019 | 12/1997 | Chang | 437/67 |
| 5,753,554 | 5/1998 | Park | 438/259 |

OTHER PUBLICATIONS

*Solid State Technology*, Plasma Technology, "High–density plasma CVD and CMP for 0.25–μm intermetal dielectric processing", J. T. Pye, H. W. Fry, and W. J. Schaffer, Dec., 1995, pp. 65–71.

*Solid State Technology*, Deposition, "Interconnect metallization for future device generations", Bruce Roberts, Alain Harrus and Robert L. Jackson, Feb., 1995, pp. 69–78.

*Solid State Technology*, A Four–Metal Layer, High Performance Interconnect System for Bipolar and BiCMOS Circuits, Syd R. Wilson, John L. Freeman, Jr., and Clarence J. Tracy, Nov., 1991, pp. 67–71.

*Primary Examiner*—Tom Dunn
*Assistant Examiner*—Peter DiMauro
*Attorney, Agent, or Firm*—Amin, Eschweiler & Turocy, LLP

[57] ABSTRACT

A method of preventing poly stringers in the formation of a memory device includes the steps of forming at least one field oxide region in a substrate and forming a tunnel oxide over the substrate. A first polysilicon layer is then formed over the tunnel oxide and a poly mask having a mask profile is formed over the first polysilicon layer. The first polysilicon layer is then etched in portions exposed by the poly mask, thereby creating a first polysilicon layer etch profile, wherein the first polysilicon layer etch profile is substantially ideally anisotropic and independent of the mask profile. An insulating layer and a conductive layer is then formed over the etched first polysilicon layer and portions of the conductive layer are then etched to form word lines. The insulating layer is then etched in regions adjacent the word lines, thereby leaving a substantially vertical insulative fence along the first polysilicon layer etch profile. Lastly, the first polysilicon layer is again etched in regions adjacent the word lines, wherein the etching of the first polysilicon layer is substantially anisotropic and removes substantially all the polysilicon in the regions adjacent the word lines, resulting in the prevention of poly stringers.

12 Claims, 9 Drawing Sheets

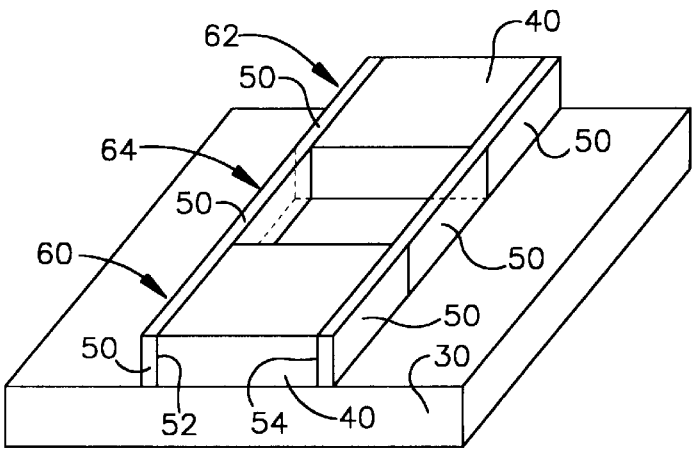
FIGURE 5
(PRIOR ART)
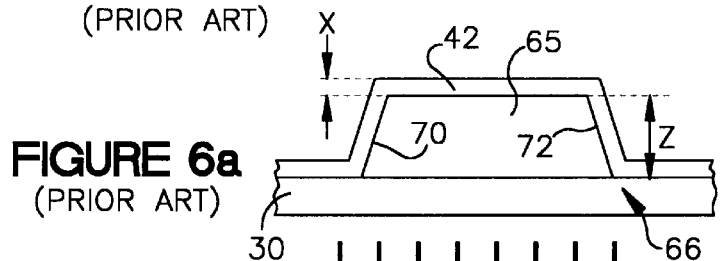
FIGURE 6a
(PRIOR ART)
FIGURE 6b
(PRIOR ART)
FIGURE 6c
(PRIOR ART)
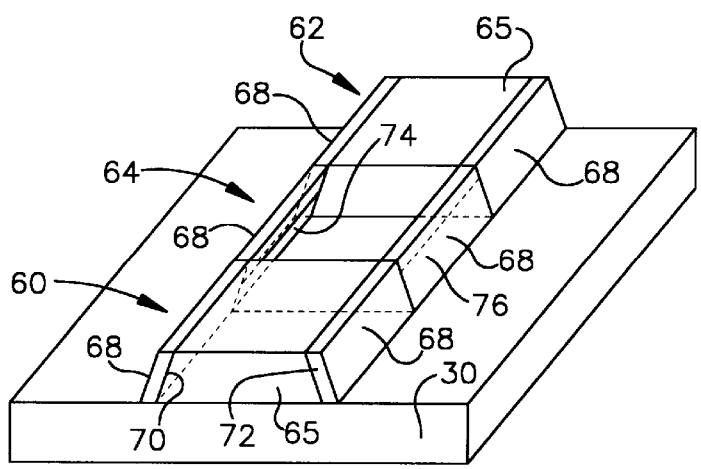
FIGURE 7
(PRIOR ART)

ELIMINATION OF POLY STRINGERS WITH STRAIGHT POLY PROFILE

FIELD OF THE INVENTION

The present invention generally relates to integrated circuits and, in particular, to a method of flash memory fabrication which improves memory cell reliability and manufacturability by substantially preventing the formation of poly stringers by forming a substantially straight polysilicon etch profile that is independent of the overlying photomask profile and alignment.

BACKGROUND OF THE INVENTION

Semiconductor devices typically include multiple individual components formed on or within a substrate. Such devices often comprise a high density section and a low density section. For example, as illustrated in prior art FIG. 1, a memory device such as a flash memory 10 comprises one or more high density core regions 12 and a low density peripheral portion 14 on a single substrate 16. The high density core regions 12 typically consist of at least one M×N array of individually addressable, substantially identical memory cells and the low density peripheral portion 14 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

The memory cells within the core portion 12 are coupled together in a circuit configuration, such as the configuration illustrated in prior art FIG. 2. Each memory cell 20 has a drain 22, a source 24 and a stacked gate 26. Each stacked gate 26 is coupled to a word line (WL0, WL1, . . . , WLn) while each drain 22 is coupled to a bit line (BL0, BL1, . . . , BLn). Lastly, each source 24 is coupled to a common source line CS. Using peripheral decoder and control circuitry, each memory cell 20 can be addressed for programming, reading or erasing functions.

Prior art FIG. 3 represents a fragmentary cross section diagram of a typical memory cell 20 in the core region 12 of prior art FIGS. 1 and 2. Such a cell 20 typically includes the source 24, the drain 22 and a channel 28 in a substrate 30; and the stacked gate structure 26 overlying the channel 28. The stacked gate 26 further includes a thin gate dielectric layer 32 (commonly referred to as the tunnel oxide) formed on the surface of the substrate 30. The stacked gate 26 also includes a polysilicon floating gate 34 which overlies the tunnel oxide 32 and an interpoly dielectric layer 36 overlies the floating gate 34. The interpoly dielectric layer 36 is often a multilayer insulator such as an oxide-nitride-oxide (ONO) layer having two oxide layers 36*a* and 36*b* sandwiching a nitride layer 36*c*. Lastly, a polysilicon control gate 38 overlies the interpoly dielectric layer 36. The control gates 38 of the respective cells 20 that are formed in a lateral row share a common word line (WL) associated with the row of cells (see, e.g., prior art FIG. 2). In addition, as highlighted above, the drain regions 22 of the respective cells in a vertical column are connected together by a conductive bit line (BL). The channel 28 of the cell 20 conducts current between the source 24 and the drain 22 in accordance with an electric field developed in the channel 28 by the stacked gate structure 26.

According to conventional operation, the flash memory cell 20 operates in the following manner. The cell 20 is programmed by applying a relatively high voltage $V_G$ (e.g., approximately 12 volts) to the control gate 38 and a moderately high voltage $V_D$ (e.g., approximately 9 volts) to the drain 22 in order to produce "hot" (high energy) electrons in the channel 28 near the drain 22. The hot electrons accelerate across the tunnel oxide 32 and into the floating gate 34 and become trapped in the floating gate 34 since the floating gate 34 is surrounded by insulators (the interpoly dielectric 36 and the tunnel oxide 32). As a result of the trapped electrons, the threshold voltage of the cell 20 increases by about 3 to 5 volts. This change in the threshold voltage (and thereby the channel conductance) of the cell 20 created by the trapped electrons is what causes the cell to be programmed.

To read the memory cell 20, a predetermined voltage $V_G$ that is greater than the threshold voltage of an unprogrammed cell, but less than the threshold voltage of a programmed cell, is applied to the control gate 38. If the cell 20 conducts, then the cell 20 has not been programmed (the cell 20 is therefore at a first logic state, e.g., a zero "0"). Likewise, if the cell 20 does not conduct, then the cell 20 has been programmed (the cell 20 is therefore at a second logic state, e.g., a one "1"). Consequently, one can read each cell 20 to determine whether it has been programmed (and therefore identify its logic state).

In order to erase the flash memory cell 20, a relatively high voltage $V_S$ (e.g., approximately 12 volts) is applied to the source 24 and the control gate 38 is held at a ground potential ($V_G$=0), while the drain 24 is allowed to float. Under these conditions, a strong electric field is developed across the tunnel oxide 32 between the floating gate 34 and the source region 22. The electrons that are trapped in the floating gate 34 flow toward and cluster at the portion of the floating gate 34 overlying the source region 22 and are extracted from the floating gate 34 and into the source region 22 by way of Fowler-Nordheim tunneling through the tunnel oxide 32. Consequently, as the electrons are removed from the floating gate 34, the cell 20 is erased.

During the processing of the core portion 12 having a circuit configuration as illustrated in prior art FIG. 2 and a structure as illustrated in prior art FIG. 3, a problem sometimes occurs involving poly stringers. The manner in which poly stringers are formed is illustrated in conjunction with prior art FIGS. 4*a*–7. Poly stringers result from (among other things) imperfect anisotropic etching of the floating polysilicon gate 34 (when delineating memory cells 20 along a given word line) and the subsequent shielding of some polysilicon material by an ONO "fence."

An ideally anisotropically etched polysilicon gate 40 is illustrated in prior art FIG. 4*a* with an oxide-nitride-oxide (ONO) layer 42 overlying the gate 40. Note that at regions 44 and 46 the ONO layer 42 exhibits a film thickness "X" while at a region 48 (along the sidewalls of the gate 40) the ONO layer 42 exhibits a film thickness "Y", wherein X<<Y. Consequently, as illustrated in prior art FIG. 4*b*, when the ONO layer 42 is subsequently etched, removing a film thickness of X, an ONO fence 50 is left along the sidewalls 52 and 54 of the polysilicon gate 40. Subsequently, when portions of the polysilicon gate 40 are again etched to define the various word lines for the memory device, the ONO fence 50 remains, as illustrated in prior art FIG. 4*c*.

The manner in which the ONO fence 50 remains after the second etching of the polysilicon gate 40 may best be understood in its macroscopic context, as illustrated in prior art FIG. 5. In FIG. 5, the polysilicon gate 40 rests on the substrate 30 (actually, it rests on a thin tunnel oxide which, although not shown for simplicity, overlies the substrate 30). The ONO fence 50 remains along the sidewalls 52 and 54 in the regions 60 and 62 where a first word line (WL1) and a second word line (WL2) are formed in a manner similar to prior art FIG. 4b. (Note that the additional layers that make up the stacked gate structure 26 are not shown in prior art FIG. 5 for the sake of simplicity.) In an etched region 64, which delineates the regions 60 and 62 (and consequently the word lines WL1 and WL2) the ONO fence 50 also remains in a manner similar to prior art FIG. 4c.

As long as the initial etching of the polysilicon gate 40 (which delineates cells 20 along a single word line) occurs in an ideally anisotropic manner, as illustrated in prior art FIGS. 4a–4c and FIG. 5, no poly stringers are formed during the second etching of the gate 40 (which delineates separate word lines). It is well known, however, that anisotropic etch processes do not repeatably provide ideally anisotropic profiles. Instead, most anisotropic etch processes provide non-ideal profiles in the range of about 85–95° (wherein 90° is ideal). A non-ideal anisotropic etch profile 65 is illustrated in prior art FIG. 6a. When the ONO layer 42 of FIG. 6a is etched, an angled ONO fence 68 is left on the sloped sidewalls 70 and 72 of the polysilicon gate 65 because the region 66 has a film thickness "Z" along the sidewalls 70 and 72 that is thicker than the film thickness "X". Consequently, the angled ONO fence 68 remains, as illustrated in prior art FIG. 6b.

When the polysilicon gate 65 is subsequently etched (in an anisotropic manner via, e.g., reactive ion etching (RIE)), as illustrated in prior art FIGS. 6b and 6c, the angled ONO fence 68 shields a portion of the polysilicon gate 65, resulting in remnants 74 and 76 of polysilicon, which are the poly stringers. Transposing the non-ideally anisotropic polysilicon gate 65 and the resulting poly stringers 74 and 76 of FIGS. 6a–6c into their macroscopic context (as illustrated in prior art FIG. 7), it is clear that the poly stringers 74 and 76 pose a substantial reliability problem since the poly stringers 74 and 76 in the etched region 64 can short out the word lines in regions 60 and 62, respectively. That is, instead of the etched region 64 electrically isolating the word lines in regions 60 and 62 from one another, the poly stringers 74 and 76 (which are conductive) span the etched region 64, shielded by the angled ONO fence 68 and cause the gates 65 in the regions 60 and 62 to be shorted together.

Consequently, there is a strong need in the art to form memory devices without poly stringers and thereby reduce reliability problems due to shorted word lines.

SUMMARY OF THE INVENTION

The present invention embodies a method of substantially preventing the formation of poly stringers during the fabrication of a memory device by making the etch profile of the first polysilicon layer (which forms the floating gate of the various memory cells) independent of the overlying photoresist mask profile. By decoupling the polysilicon profile from the photoresist mask profile, a substantially ideal anisotropic polysilicon etch profile may be regularly achieved independently of whether the photoresist mask is misaligned. The substantially ideal anisotropic polysilicon etch profile results in a substantial reduction of poly stringers since an ONO fence that is subsequently formed during the device fabrication is not sloped. Consequently, the ONO fence does not substantially shield polysilicon material when the device word lines are subsequently formed.

According to one aspect of the present invention, the polysilicon etch profile is made substantially independent of the overlying photoresist mask profile by performing a highly selectivity polysilicon-to-photoresist etch.

According to another aspect of the present invention, a plasma etch chemistry employs a reduced chamber pressure and an increased plasma excitation power to increase the polysilicon-to-photoresist etch selectivity.

According to yet another aspect of the present invention, a highly selective polysilicon etch includes a dry $HBrCl_2HeO_2$ RIE chemistry with a HBr flow rate of about 50 sccm (standard cubic centimeters per minute), a $Cl_2$ flow rate of about 15 sccm and an $HeO_2$ flow rate of about 5 sccm. The etch is performed in an etch chamber having a pressure of about 60 mTorr with a plasma excitation power of about 220 W.

To the accomplishment of the foregoing and related ends, the invention comprises the features hereinafter fully described and particularly pointed out in the claim. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 5 is a perspective view of a prior art polysilicon gate region that has been etched to form separate word lines, wherein an ONO fence spans a region between the word lines;

FIG. 6a is a fragmentary cross section illustrating a prior art polysilicon gate having a non-ideal anisotropically etched profile covered by an ONO layer;

FIG. 6b is a fragmentary cross section illustrating a prior art polysilicon gate and an etched ONO layer forming an angled ONO fence;

FIG. 6c is a fragmentary cross section illustrating a prior art etched polysilicon region having a remaining angled ONO fence and poly stringers;

FIG. 7 is a perspective view of a prior art polysilicon gate region that has been etched to form separate word lines, wherein an angled ONO fence and poly stringers span a region between the word lines, thereby shorting the word lines together;

DETAILED DESCRIPTION OF THE INVENTION

Figure 1:
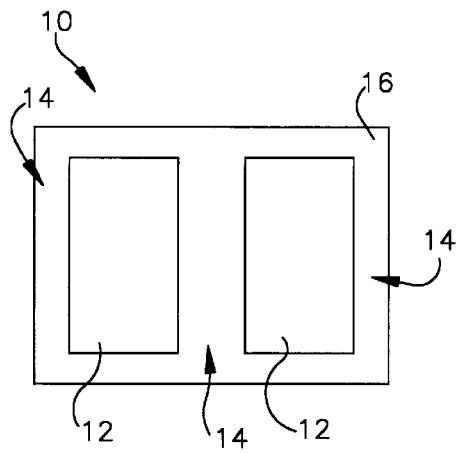
FIG. 1 is a plan view illustrating a prior art layout of a flash memory chip.

The present invention will now be described with reference to the drawings wherein like reference numerals are used to refer to like elements throughout. An embodiment of the present invention includes a method of substantially preventing the formation of poly stringers during the formation of a memory device by making the etch profile of the first polysilicon layer substantially independent of the overlying photoresist mask profile. The polysilicon etch profile is made independent of the photoresist mask profile according to one aspect of the present invention by substantially increasing the polysilicon-to-photoresist selectivity. The etch selectivity may be increased in a variety of ways and each are contemplated as falling within the scope of the present invention.

In one exemplary embodiment of the present invention a polysilicon etch is modified by substantially increasing the plasma excitation power and substantially decreasing the etching chamber pressure to make the polysilicon etch profile independent of the overlying photoresist mask profile. In another exemplary embodiment of the present invention, another polysilicon etch chemistry is utilized to achieve an independent polysilicon etch profile.

Figure 2:
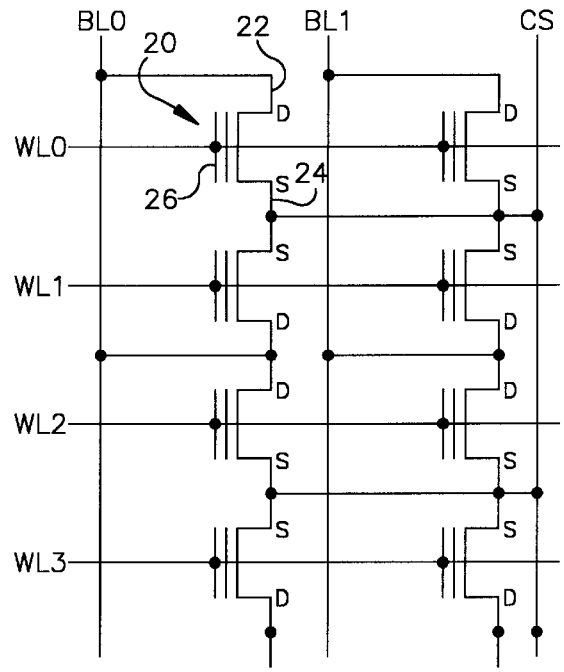
FIG. 2 is a schematic diagram illustrating a prior art core portion of a flash memory circuit.
Figure 3:
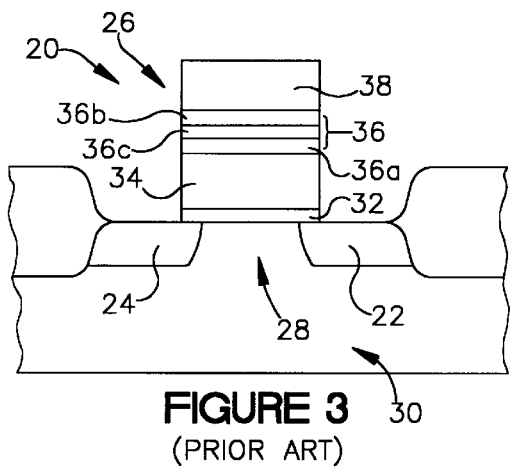
FIG. 3 is a fragmentary cross section illustrating a prior art stacked gate flash memory cell.
Figure 4A:
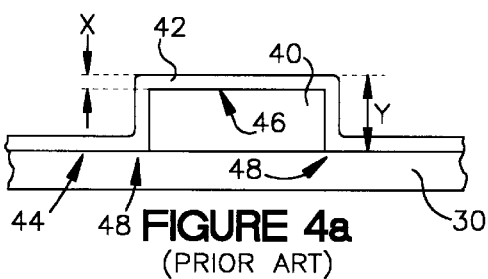
FIG. 4a is a fragmentary cross section illustrating a prior art polysilicon gate covered by an ONO layer.
Figure 4C:
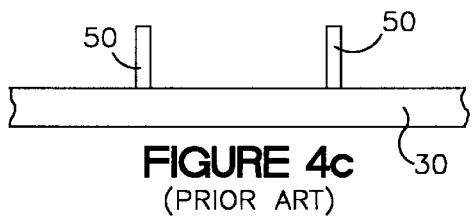
FIG. 4c is a fragmentary cross section illustrating a prior art etched polysilicon region having a remaining ONO fence.
Figure 4B:
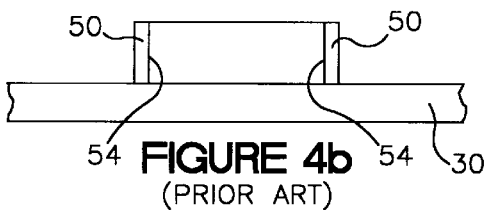
FIG. 4b is a fragmentary cross section illustrating a prior art polysilicon gate and an etched ONO layer forming an ONO fence.

In the present invention it was appreciated that non-ideal anisotropic polysilicon etch profiles may result due to a misalignment of an overlying photoresist mask which is used in defining the multiple flash memory cells along a given word line. Previously, photomask misalignment has not been an issue since larger memory cell spacing provided sufficient polysilicon overlap over the core field oxide region. Photoresist mask misalignment, however, has now been recognized as a problem as the cell size of the flash memory cells are aggressively reduced to increase the memory capacity for each memory device. As is well known by those skilled in the art, NAND type memory circuit arrangements, such as that illustrated in prior art FIG. 2, are often desirable since the packing density of the memory cells is greater than NOR-type memory cell configurations. As the size of the memory cells is further reduced, the spacing between the memory cells is also reduced. With the reduced spacing between the respective memory cells along a given word line, a misalignment of a photoresist mask may result in a non-ideal anisotropic polysilicon etch profile and thereby contribute to the fabrication of poly stringers. This problem is illustrated in prior art FIGS. 8a–8f.

Figure 8A:
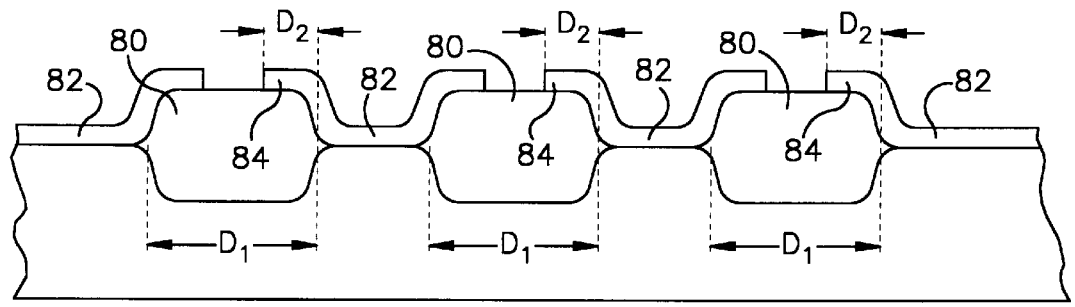
FIGS. 8a–8f are fragmentary cross sections illustrating core field oxide spacing and first polysilicon layer overlap and how misalignment of a photoresist mask contributes to the formation of non-ideal anisotropic polysilicon etch profiles.
Figure 8B:
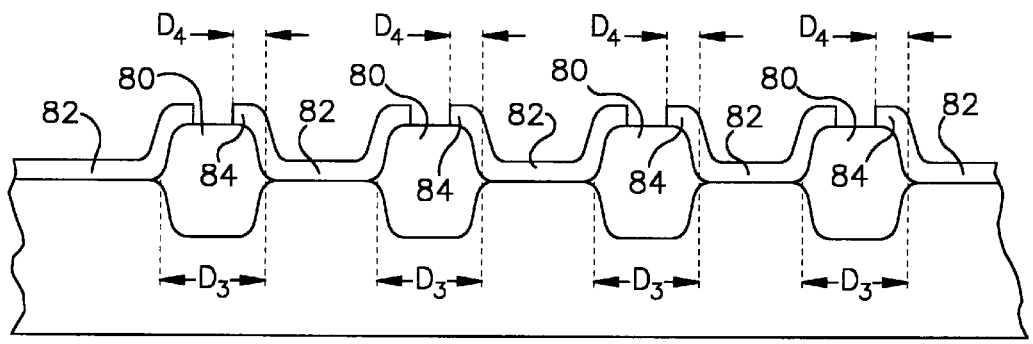

Each memory cell along a given word line is isolated from one another by a core field oxide region 80, as illustrated in FIG. 8a. In previous prior art memory designs, each core field oxide region 80 was substantially large (having a length "$D_1$"), thereby providing a substantial amount of room for each polysilicon region 82 (which forms the floating gate for the respective memory cells) to modestly overlap a portion 84 ("$D_2$") of the field oxide region 80 without electrically contacting an adjacent floating gate. As the spacing between the memory cells decrease, however (as illustrated in FIG. 8b, e.g., a core field oxide having a length "$D_3$", wherein $D_3<D_1$), the amount of polysilicon-to-core field oxide overlap ("$D_4$") also decreases ($D_4<D_2$), thereby making the polysilicon regions 82 (floating gates) susceptible to photoresist mask misalignment errors. Misalignment is a function of a lateral spacing offset of a photoresist mask overlying the polysilicon layer 82 to be etched, as illustrated in FIGS. 8c and 8d.

Figure 8C:
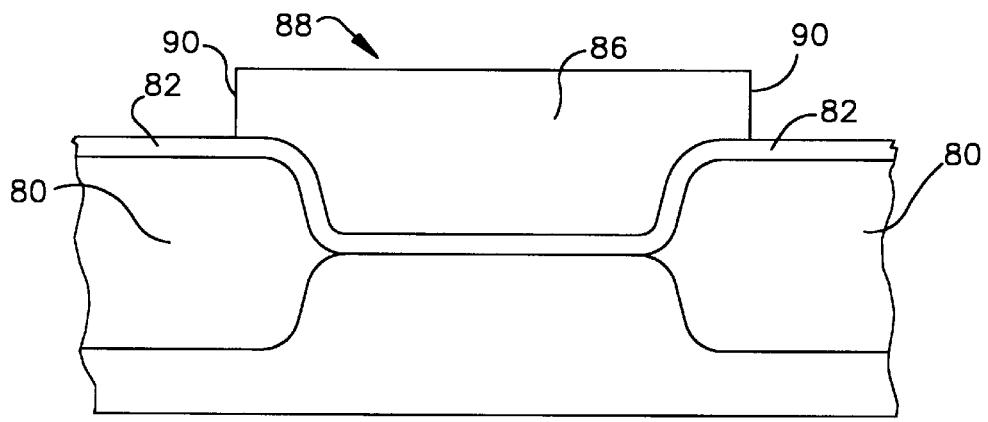

In FIG. 8c, the core field oxide regions 80 are overlaid with the uniform polysilicon layer 82. The polysilicon layer 82 (which will be etched to form the floating gates for the respective memory cells) has a photoresist mask 86 overlying it, wherein the photoresist mask 86 is properly aligned over a center portion 88 between the core field oxide regions 80. Note that each vertical edge 90 of the photoresist mask 86 overlies a flat portion of the polysilicon layer 82 which makes the photoresist mask profile substantially vertical, thereby allowing the subsequently etched polysilicon layer 82 to approximate an ideally anisotropic etch profile 91, as illustrated in FIG. 8d.

Figure 8D:
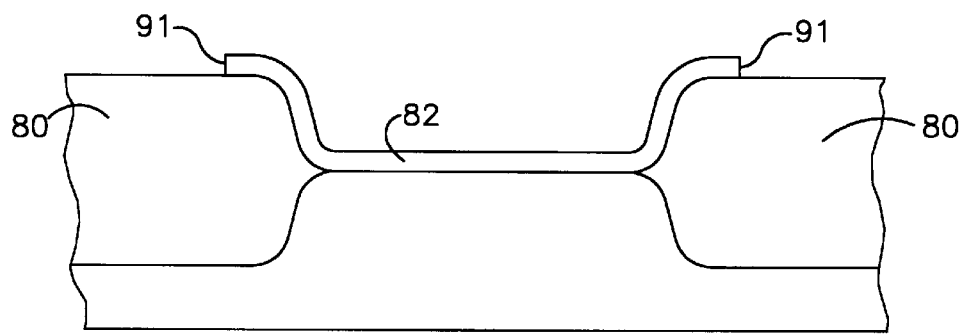
Figure 8E:
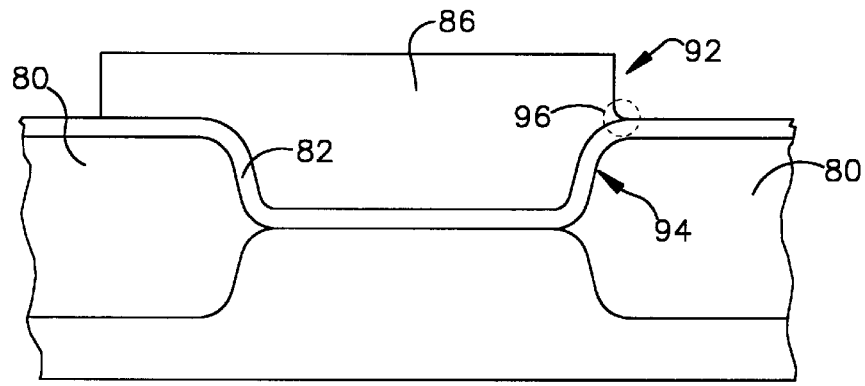
Figure 8F:
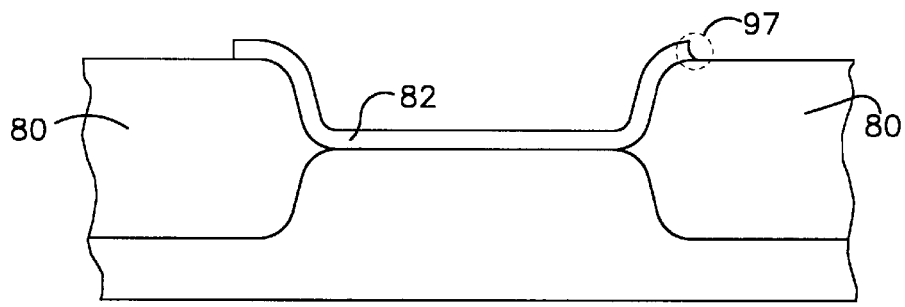

In FIG. 8e, the core field oxide regions 80 and the polysilicon layer 82 are positioned in a manner similar to that of FIGS. 8c and 8d. The photoresist mask 86, however, is laterally misaligned (or offset) so that an edge 92 of the photoresist mask 86 does not rest on a flat lateral surface, but rather overlies a sloped portion 94 of the polysilicon layer 82, thereby forming a tail portion 96. The tail portion 96 results in a region where the photomask material 86 is not a uniform thickness. Therefore as the polysilicon layer 82 is subsequently etched to define the various memory cells along a given word line, the polysilicon etch profile 97 is not approximately anisotropic, but rather exhibits a substantially sloped profile, as illustrated in FIG. 8f. As discussed supra in conjunction with prior art FIGS. 6a–6c, sloped polysilicon etch profiles result in overlying angled ONO fences (which are formed later) which contribute to the formation of poly stringers due to the lateral shielding of polysilicon material. Consequently, the misalignment of the photoresist mask 86 (which is of greater concern as the memory cells are aggressively reduced in size) contributes to the formation of poly stringers by creating non-ideal anisotropic polysilicon etch profiles.

The present invention decouples the polysilicon etch profile from the overlying photoresist mask profile to thereby provide substantially ideal anisotropic polysilicon etch profiles. Consequently, anisotropic polysilicon etch profiles are achieved regardless of whether a photoresist mask misalignment occurs, thereby substantially improving the manufacturability of the memory devices.

Figure 9A:
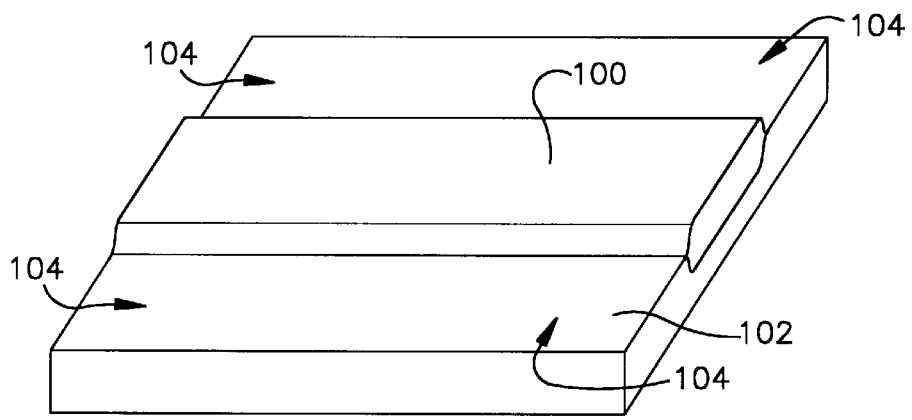
FIGS. 9a–9o are perspective and fragmentary cross section views illustrating a method for forming a flash memory device without poly stringers according to the present invention.

A method of forming a flash memory cell without poly stringers according to one aspect of the present invention will be described in conjunction with FIGS. 9a–9o. The manufacture of a flash memory cell according to one exemplary embodiment of the present invention begins with the formation of one or more field oxide regions 100 in a semiconductor substrate 102, as illustrated in FIG. 9a. The field oxide region 100 is conventionally formed by, for example, growing a layer of thermal oxide (also called "barrier oxide" or "pad oxide") over the surface of the substrate 102. A masking layer (not shown), frequently composed of nitride, is deposited on the barrier oxide and patterned to cover regions 104 of the substrate 102 in which memory cells are to be formed. After patterning the masking layer, the field oxide 100 is grown to a thickness of about 6,500 Angstroms in the exposed areas of the thermal oxide by, for example, local oxidation of silicon ("LOCOS"). The field oxide region 100 will provide electrical isolation between the various active regions 104 in which the memory cells will lie. After growing the field oxide 100, the masking layer and thermal oxide are stripped to expose the underlying substrate 102 in the regions 104, as illustrated in FIG. 9a.

Figure 9B:
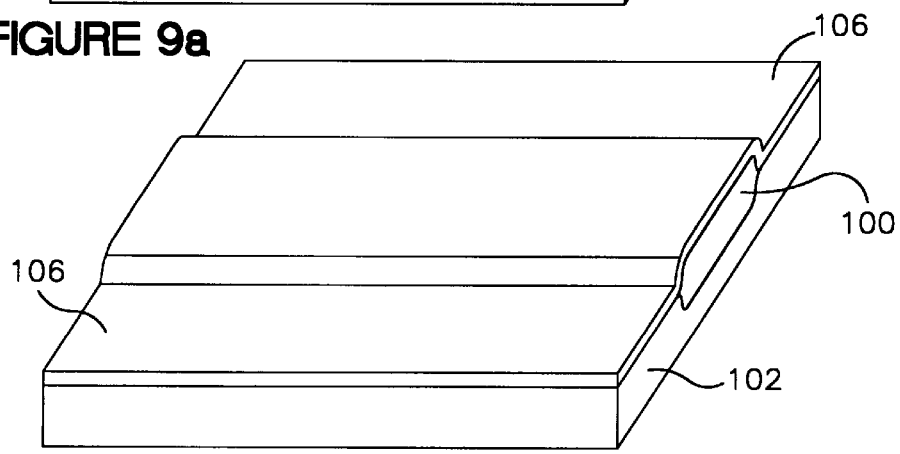

After the formation of the field oxide regions 100, a thin tunnel oxide layer (not shown) is formed over the substrate 102 having a thickness of, for example, about 50–150 Angstroms using a thermal growth process in a dry oxidation furnace. After formation of the tunnel oxide, a first layer of polycrystalline silicon 106 ("polysilicon") having a thickness of about 700 Angstroms is deposited via, for example, low pressure chemical vapor deposition ("LPCVD") and doped via, for example, diffusion doping or ion implantation doping techniques to thereby make the first polysilicon layer less resistive. The deposited first polysilicon layer 106 is illustrated in FIG. 9b. (Note that the tunnel oxide underlies the first polysilicon layer 106, however, due to its relative thinness and for the sake of simplicity, the tunnel oxide layer is not shown in the figures.)

Figure 9C:
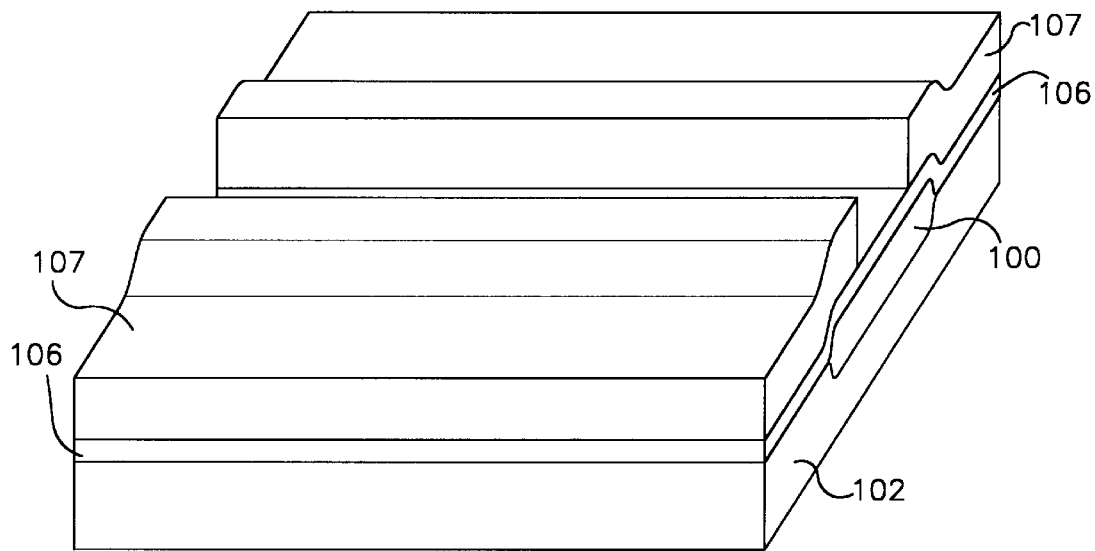
Figure 9D:
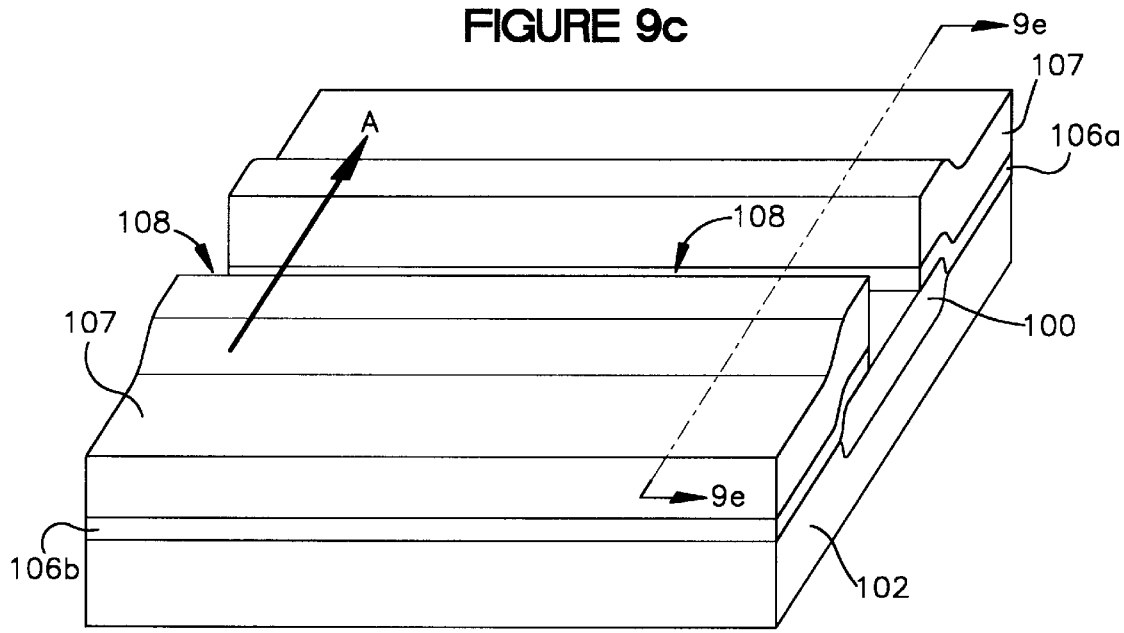
Figure 9E:
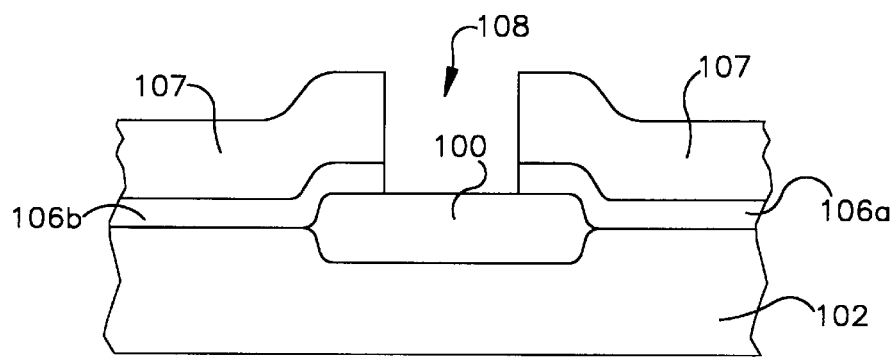

Subsequent to the deposition and doping of the first polysilicon layer 106, the layer 106 is etched to define the memory cells along the length of a single word line (which has not yet been defined), as illustrated in FIGS. 9c–9h. In one method according to the present invention, the etching of the polysilicon layer 106 is accomplished by depositing a photoresist layer and patterning it to form a photoresist mask 107, as illustrated in FIG. 9c. Preferably, the photoresist mask 107 is properly aligned with respect to the field oxide region 100, however, the subsequent etch profile of the polysilicon layer 106 is substantially independent of the photoresist mask profile (which is a function of the photoresist mask alignment). The polysilicon layer 106 is then etched to form two or more electrically isolated regions 106a and 106b, separated by a region 108, as illustrated in FIG. 9d. The resultant polysilicon etch profile is illustrated in greater detail in FIG. 9e, wherein the etch profiles of the polysilicon regions 106a and 106b are approximately ideally anisotropic.

Figure 9F:
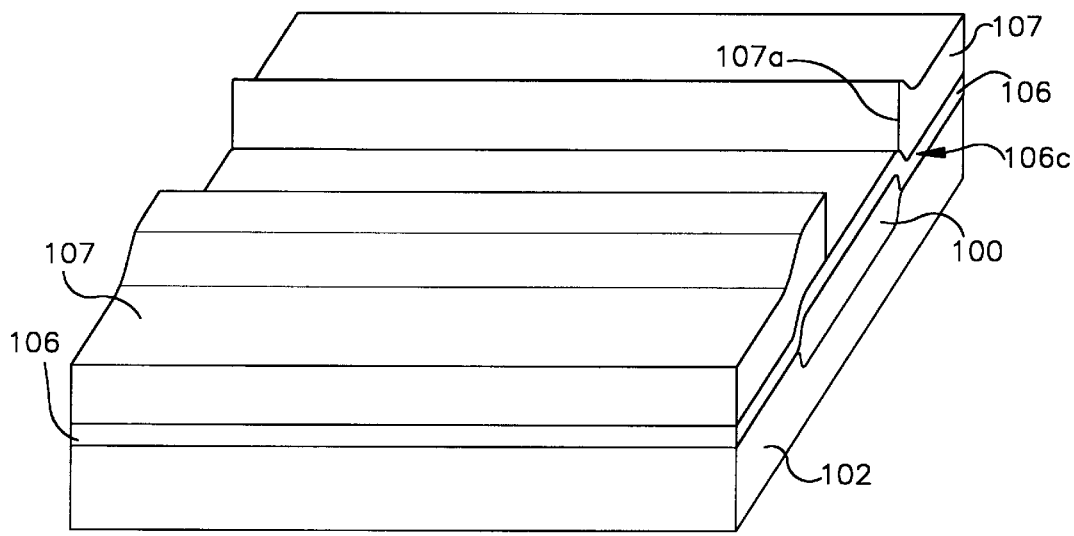
Figure 9G:
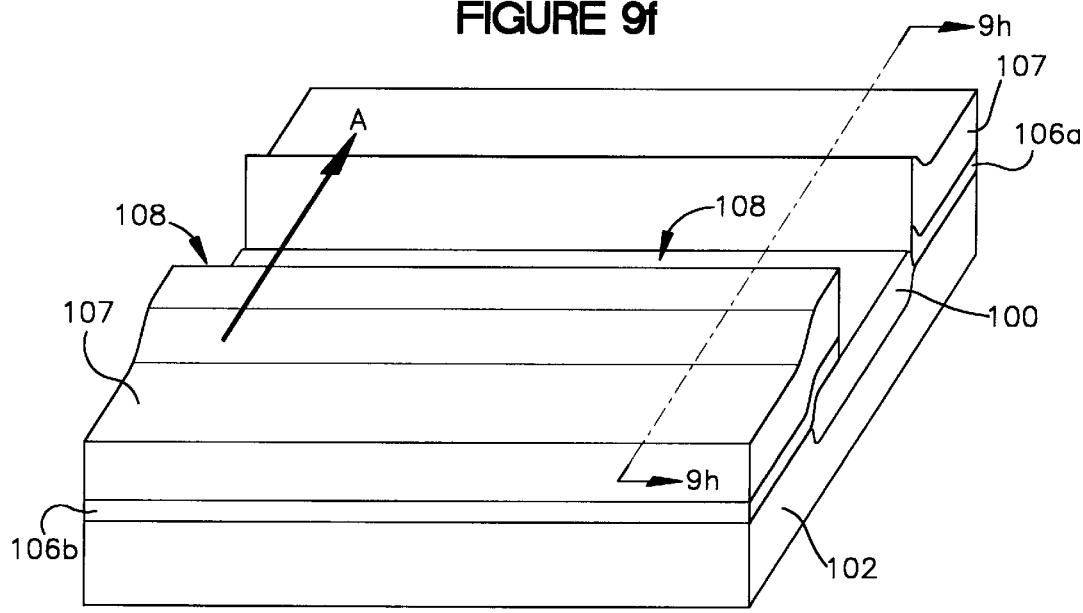
Figure 9H:
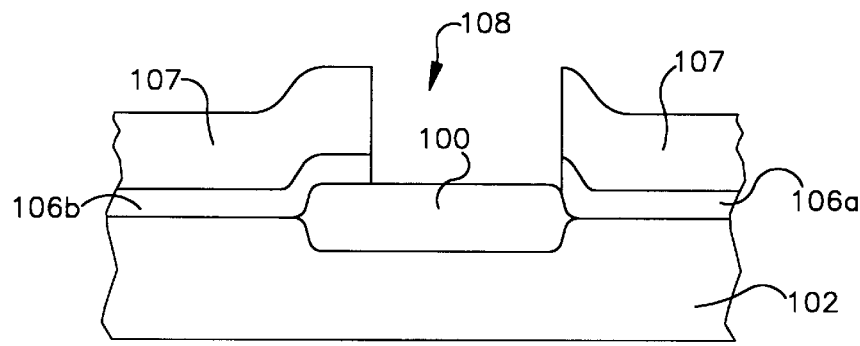

The etching of the polysilicon layer 106 according to the present invention results in a substantially ideal anisotropic etch profile which is independent of the overlying photoresist mask profile, as illustrated in greater detail in FIGS. 9f–9h. In FIG. 9f, the photoresist layer is deposited and patterned to form the photoresist mask 107 as was done in FIG. 9c. Note, however, in FIG. 9f that the photoresist mask 107 is misaligned (laterally offset) such that an edge 107a overlies a sloped portion 106c of the polysilicon layer 106. As discussed supra in conjunction with FIGS. 8e and 8f, such a photoresist mask misalignment may cause sloped polysilicon etch profiles. The present invention, however, provides a substantially ideal anisotropic polysilicon etch profile that is independent of the photoresist mask profile, as illustrated further in FIGS. 9g and 9h.

The polysilicon etch of the present invention provides a substantially ideal anisotropic profile that is independent of the overlying photoresist mask profile according to one aspect of the present invention by increasing the polysilicon-to-photoresist selectivity. Consequently, a misalignment (which may result in a tail 96 as illustrated in FIG. 8e) does not substantially impact the polysilicon etch profile because the polysilicon 106 etches at a substantially faster rate than the photoresist mask 107 (for example, a selectivity of about 4:1 or more as opposed to prior art selectivities of about 2–3:1). Therefore any manner by which the polysilicon-to-photoresist selectivity is increased over that of the prior art is contemplated as falling within the scope of the present invention.

One exemplary manner by which an increased polysilicon-to-photoresist selectivity may be achieved is taking a prior art polysilicon etch recipe and simultaneously increasing the plasma excitation power and decreasing the chamber pressure. For example, a prior art etch recipe having a $HBrCl_2$ plasma etch chemistry (wherein the HBr has a flow rate of about 70 sccm and the $Cl_2$ has a flow rate of about 30 sccm) with a chamber pressure of about 125 mTorr and a plasma excitation power of about 120 W, and a magnetic field of about 30 Gauss may be modified by increasing the power and decreasing the pressure. For example, the power may be increased to a range of about 200–350 W and the pressure may be decreased to a range of about 30–60 mTorr. In doing so, the etch selectivity is increased, resulting in substantially ideal anisotropic polysilicon etch profiles that are independent of the photoresist mask profile (alignment).

In another exemplary embodiment of the present invention, a $HBrCl_2HeO_2$ plasma etch chemistry may be utilized to increase the polysilicon-to-photoresist selectivity. In this exemplary embodiment, the HBr has a flow rate of about 50 sccm, the $Cl_2$ has a flow rate of about 15 sccm and the $HeO_2$ has a flow rate of about 5 sccm while the chamber pressure is about 60 mTorr, the power is about 220 W and the magnetic field is about 100 Gauss. The above exemplary polysilicon etch recipe was found to provide improved selectivity and provided substantially ideal anisotropic polysilicon etch profiles that were independent of the overlying photoresist mask profile.

In yet another exemplary embodiment of the present invention, a $HBrCl_2HeO_2$ plasma etch chemistry may be utilized, wherein the HBr has a flow rate of about 50 sccm, the $Cl_2$ has a flow rate of about 15 sccm and the $HeO_2$ has a flow rate of about 3 sccm. In addition, the above etch chemistry was used in a chamber having a pressure of about 60 mTorr and a plasma excitation power of about 220 W. Again, the above exemplary etch recipe was found to provide improved selectivity and provided substantially ideal anisotropic polysilicon etch profiles.

It is appreciated that one skilled in the art may conceive of a plethora of plasma etches that improve the polysilicon-to-photoresist selectivity over that of the prior art. For example, the prior art polysilicon etch may be adjusted to increase the passivant (e.g., polymer) build-up on top of the photoresist mask as well as the photoresist mask and polysilicon sidewalls to improve the anisotropy of the etch. However, care must be taken to prevent the generation of too much passivant (which may cause potential difficulty in the subsequent removal of the photoresist mask). In addition, the etch power may be adjusted to increase the ion bombardment and thereby increase the etch rate. Furthermore, the etch pressure may be further adjusted to alter the resonance time of the ions.

In the above exemplary embodiments, substantially ideal anisotropic polysilicon etch profiles were achieved having profile angles of approximately 89–90°, wherein the prior art polysilicon etch provided profile angles of about 83–85°. The impact of the substantially ideal anisotropic polysilicon etch profile causes the subsequent ONO fence to be approximately vertical. Consequently the ONO fence will not substantially shield any polysilicon remnants when the polysilicon regions 106a and 106b are etched a second time to define the word lines. This phenomena of substantially preventing the formation of poly stringers will be discussed below in conjunction with FIGS. 9i–9o.

The layer 106 is etched using one of the above described exemplary polysilicon etch steps. The etching step removes polysilicon in the region 108 which overlies a substantial portion of the field oxide region 100, thereby separating the polysilicon layer 106 into the two or more regions 106a and 106b, respectively, which are separated from one another by the field oxide region 100. This etch step defines various memory cells along the direction "A", as illustrated in FIG. 9d. The direction "A" is the direction in which the word lines (which will be formed later in the process) will extend and wherein each region 106a and 106b of the first polysilicon layer 106 will form a separate floating gate for a memory cell along a given word line.

Figure 9I:
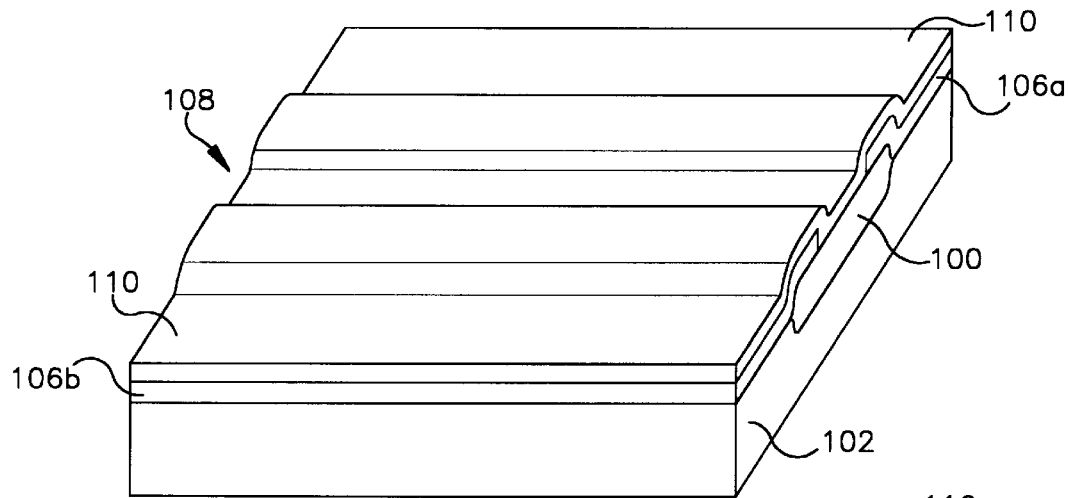

A multi-layer interpoly dielectric 110 is then formed over the surface of the substrate 102, as illustrated in FIG. 9i. This layer 110 is often called the interpoly dielectric since (as will be seen shortly) it is sandwiched between the first polysilicon layers 106a and 106b (the floating gate for each flash memory cell) and a second polysilicon layer which forms the control gate for each cell as well as the word line interconnect for each of the flash cells associated with a given word line. The interpoly dielectric 10 is preferably a three layer region of oxide/nitride/oxide (also called "ONO") and has a thickness of about 120 Angstroms. The ONO layer 110 is formed by repetitive depositions of oxide, nitride and oxide as is well known by those skilled in the art to form a dielectric layer in which the nitride is sandwiched between the two oxide layers. The ONO layer 10 overlies the entire surface of the substrate 102, including the region 108 in which the first polysilicon layer 106 was etched.

Figure 9J:
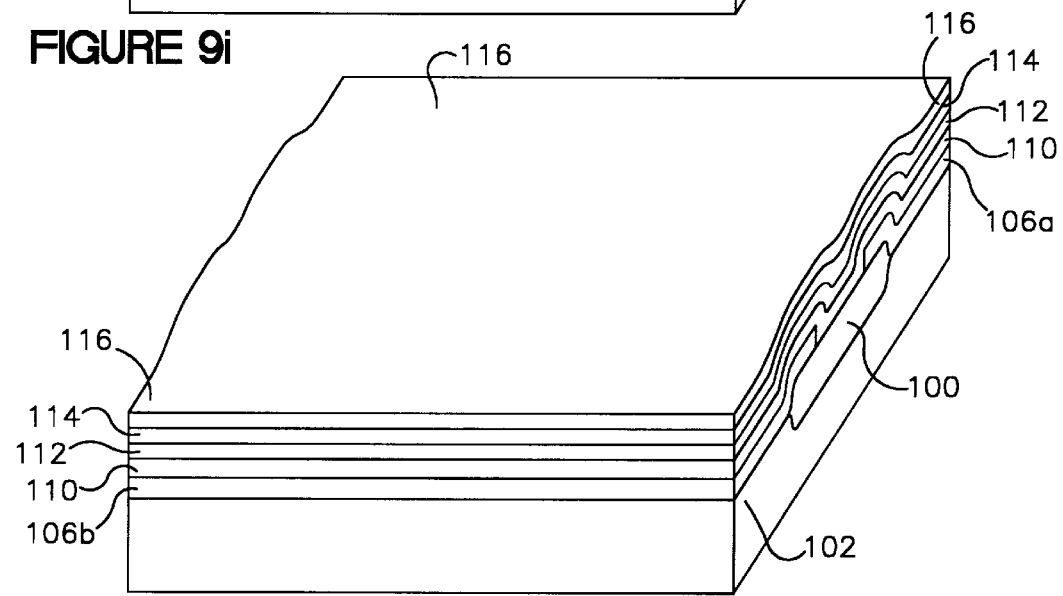

After the formation of the ONO layer 110, the remaining layers, which will complete the stack for each flash memory cell, are formed. These layers include a second polysilicon layer 112, a tungsten layer 114 (for formation of a tungsten silicide as will be described infra) and a top layer 116 consisting of an oxynitride (SiON), as illustrated in FIG. 9j.

The second polysilicon layer 112 is deposited via, for example, LPCVD and will, in conjunction with the tungsten layer 114, form the control gate for each flash cell. The second polysilicon layer 112 is also doped in a manner similar to the first polysilicon layer 106 to lower the resistivity of the region. The tungsten layer 114 is then formed by, for example, sputtering and a tungsten silicide layer is then formed by performing a thermal anneal, causing the tungsten layer 114 to react with a portion of the underlying polysilicon 112 at the interface of the two layers to form a tungsten silicide layer 118 ($WSi_x$). The silicide layer 118 provides a lower resistance contact for improved flash memory cell performance. The top layer 116 is an oxynitride layer (SiON) formed via, for example, plasma enhanced chemical vapor deposition ("PECVD") and has a thickness of about 1,000 Angstroms and may provide an anti-reflective coating and prevent any potential peeling or cracking of the underlying tungsten silicide 118.

Figure 9K:
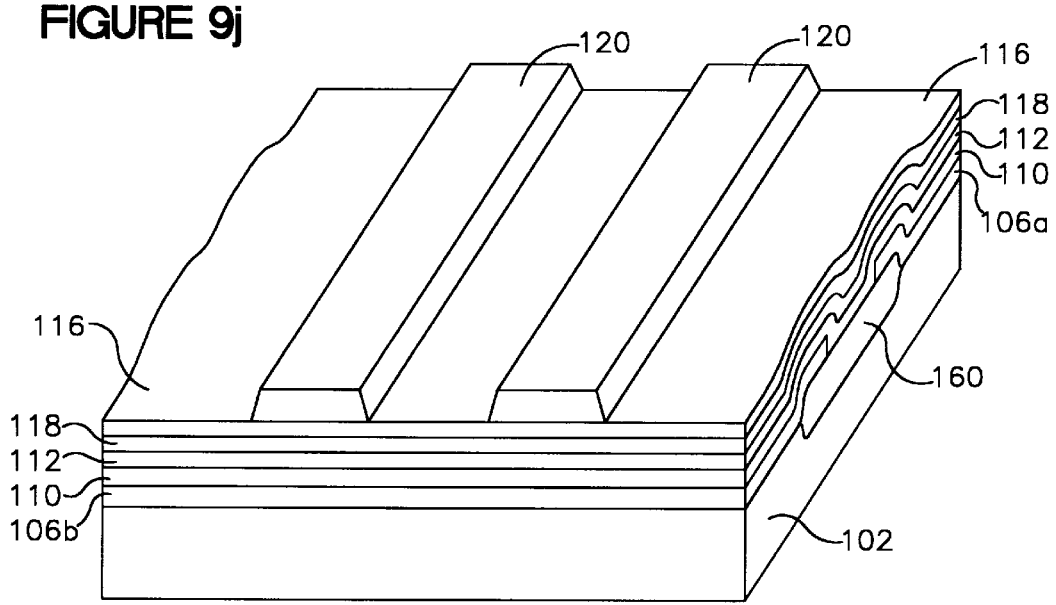
Figure 9L:
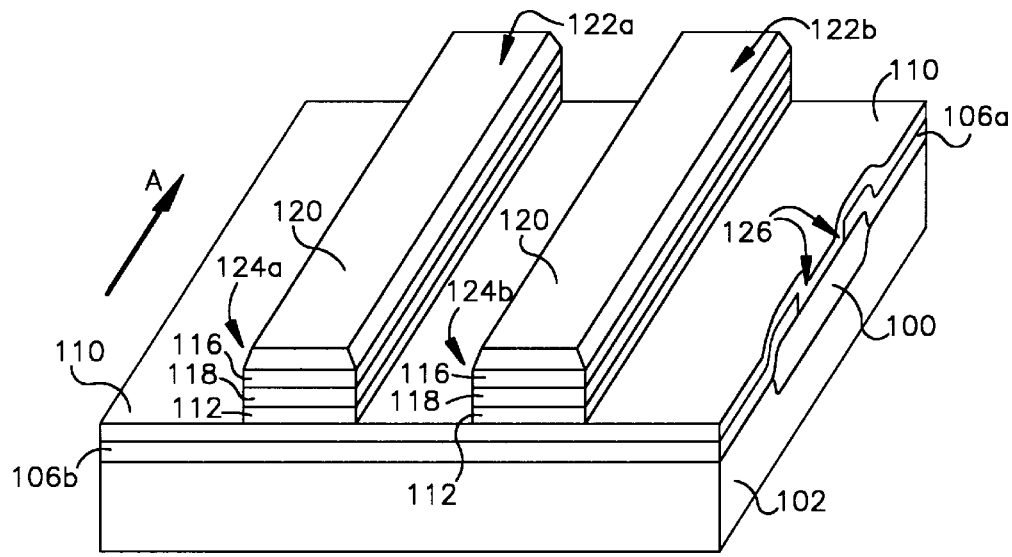

After the second polysilicon layer 112, tungsten silicide layer 118 and top layer 116 of the memory stack structure have been formed, a plurality of word lines for the memory cells are defined by etching, thereby creating stack structures. The etching is achieved by depositing and defining a photoresist masking layer 120 of approximately 8,000 Angstroms over the entire surface of the substrate 102, as illustrated in FIG. 9k. Subsequently, a number of successive etching steps are performed, wherein the top layer 116 is etched in an oxide chamber and the silicide and polysilicon layers are etched in a poly chamber according to conventional methods as is well known by those skilled in the art. The remaining word lines 122a and 122b are defined by stack structures 124a and 124b (after each of the above etch steps is completed), as illustrated in FIG. 9l. Note that in this structure the word lines 122a and 122b are formed in the direction "A" which is transverse to the etching of the first polysilicon layers 106a and 106b, respectively.

Once the second polysilicon layer 112, the tungsten silicide layer 118 and the top layer 116 have been removed, a self-align etch ("SAE") is performed to remove the ONO layer 110 and the first polysilicon regions 106a and 106b in the regions that are not covered by the stack structures 124a and 124b. The SAE etch is a two step etch process in which the ONO layer 110 is first removed followed by the removal of portions of the polysilicon regions 106a and 106b.

Figure 9M:
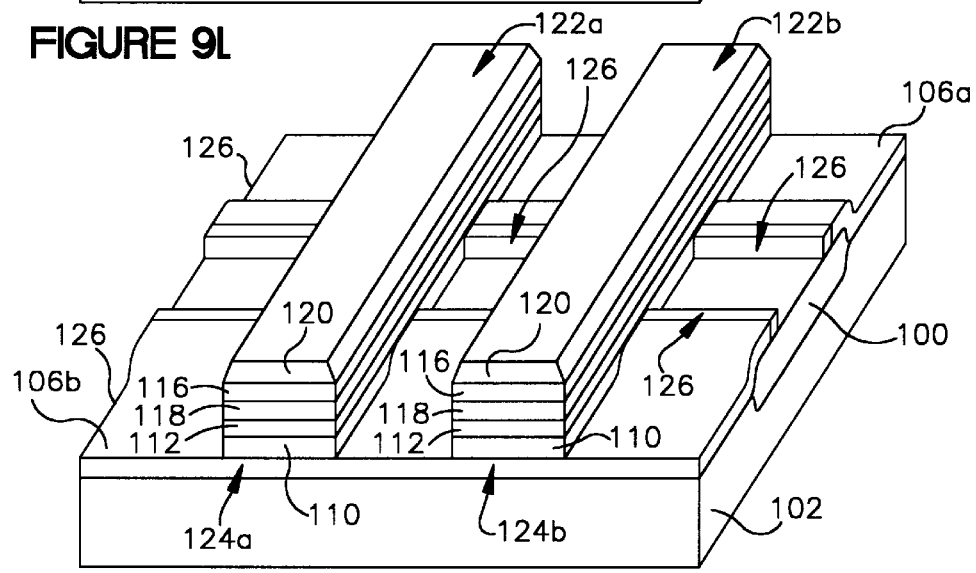

As illustrated in FIGS. 9l and 9m, the ONO layer 110 is first removed, leaving an ONO fence 126 along the substantially ideal anisotropic polysilicon profiles of regions 106a and 106b. Since the polysilicon profiles are substantially ideally anisotropic, the ONO fence 126 is approximately vertical, thereby preventing the shielding of portions of the polysilicon regions 106a and 106b during the subsequent polysilicon etch.

Figure 9N:
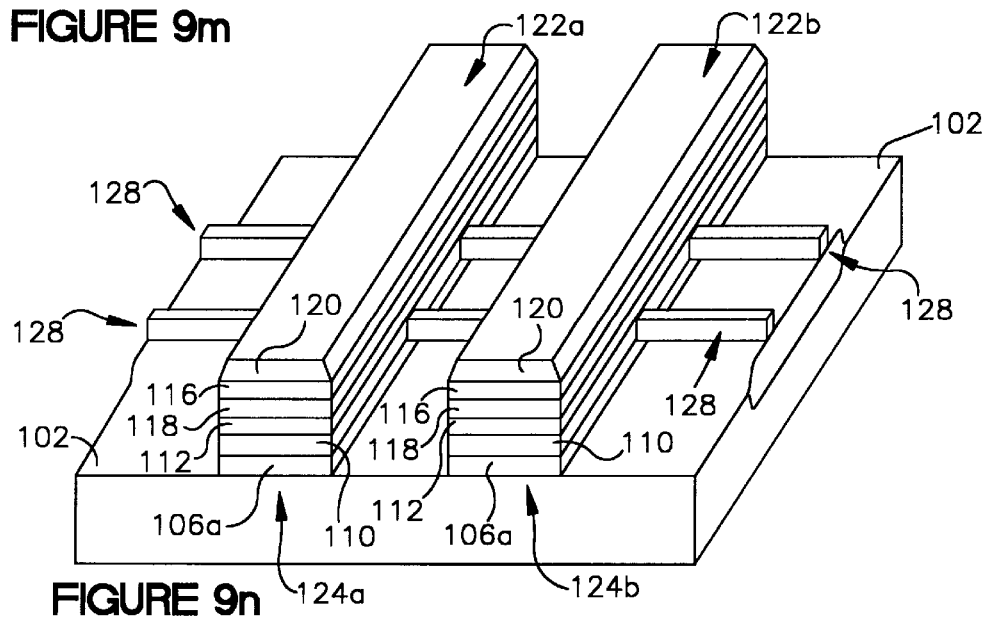

The second phase of the SAE etch is the removal of the exposed polysilicon regions 106a and 106b to thereby further define the floating gate structures for each respective word line 122a and 122b. The polysilicon etch includes, for example, an $HBrClHeO_2$ RIE etch chemistry that is highly anisotropic. Since the ONO fences 126 are substantially vertical, portions of the polysilicon layers 106a and 106b are not sufficiently shielded to result in any remnants (the poly stringers). Therefore no poly stringers are formed and the potential reliability issue of shorted word lines due to the poly stringers is eliminated. The absence of poly stringers after the poly etch is illustrated in FIG. 9n.

Figure 9O:
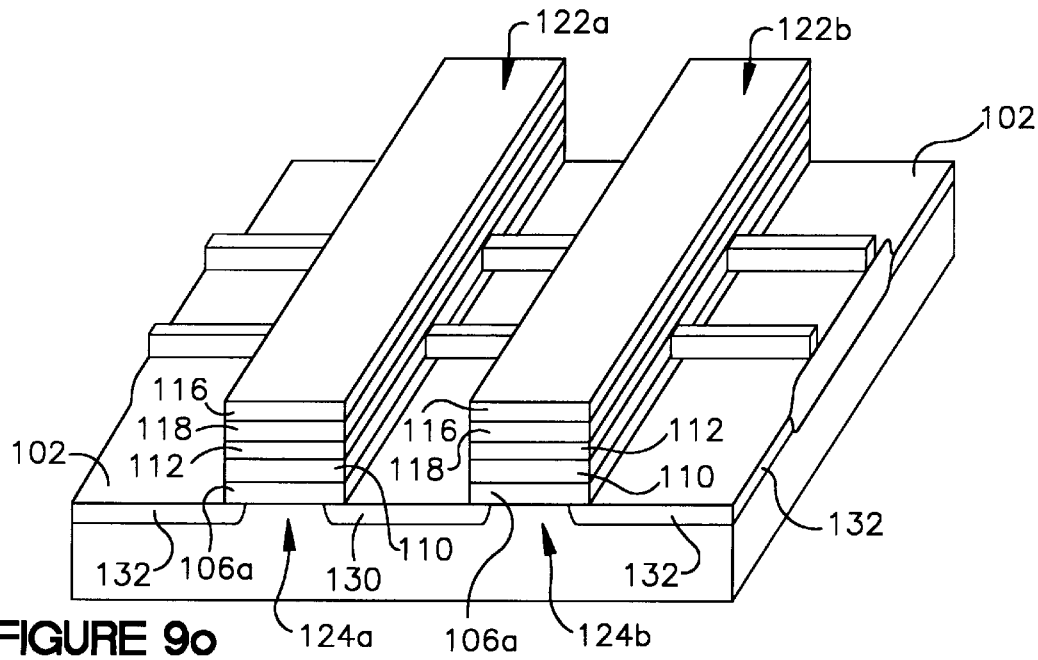

The fabrication of the flash memory cells is then completed by forming the source and drain regions 130 and 132, respectively by, for example ion implantation which is illustrated in FIG. 9o. During the formation of the source and drain regions 130 and 132, the stacked gate structures 124a and 124b serve as self-aligning mechanisms. After formation of the source and drain regions 130 and 132, the resist mask 120 is removed. In the above manner, an easy method for forming flash memory cells without poly stringers is provided.

Figure 10:
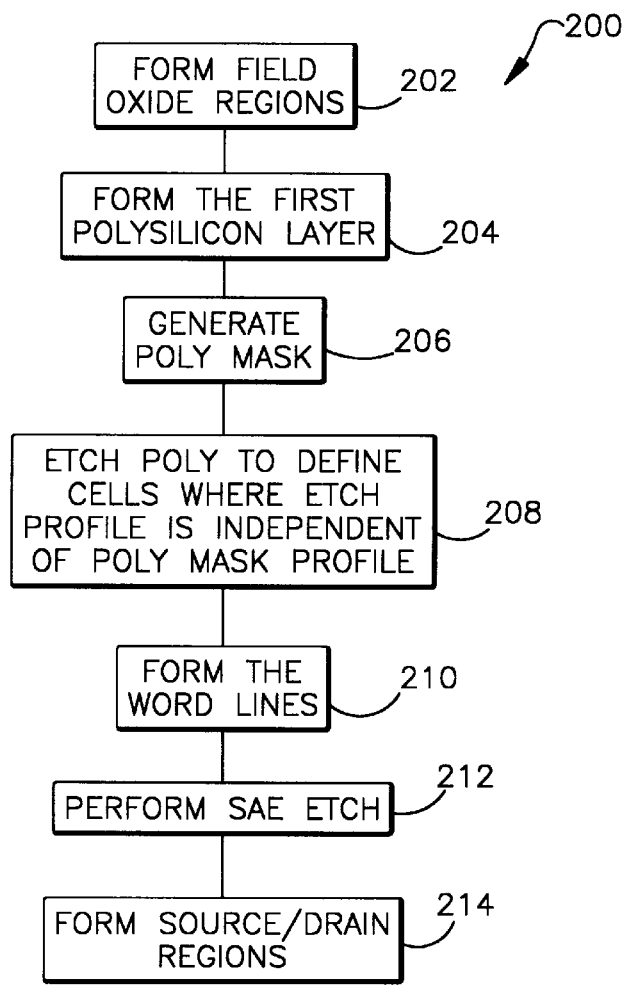
FIG. 10 is a flow chart illustrating manufacturing steps in a method for forming a flash memory without poly stringers in accordance with the embodiment of the present invention exemplified in FIGS. 9a–9o.

Although the present invention has been described in conjunction with a particular set of exemplary processing steps, the method is equally applicable to any semiconductor manufacturing process in which a flash memory device having a stacked gate structure is fabricated. This method is illustrated in the flowchart of FIG. 10. The method 200 includes the step of forming one or more field oxide regions at step 202. Any method by which a field oxide region may be formed is contemplated as falling within the scope of the present invention. Next, the first polysilicon layer (which will eventually form the floating gates of various memory cells) is formed at step 204. At step 206 a poly mask (also called a photoresist mask) is formed by depositing a masking material and patterning it to form a mask for the subsequent etching of the underlying polysilicon layer. Any method of forming the poly mask and any suitable mask material is contemplated as falling within the scope of the present invention.

After the poly mask is generated at step 206, the polysilicon layer formed at step 204 is etched in such a manner that its resulting etch profile is substantially ideally anisotropic and independent of the poly mask profile at step 208. As discussed supra, a variety of methods may be employed to decouple the polysilicon etch profile from the overlying poly mask profile. For example, step 208 may be achieved by substantially increasing the polysilicon-to-poly mask selectivity such as by increasing the plasma excitation power and decreasing the chamber pressure. Any method in which the polysilicon etch profile is made independent of the overlying poly mask profile is contemplated as falling within the scope of the present invention.

The method 200 further includes the step of forming the word lines by delineating one word line from another at step 210. Although this step is preferably accomplished by successive etch steps to remove various stack layers in regions between the desired word lines, any method by which the word lines are formed are contemplated as falling within the scope of the present invention.

After delineating the word lines at step 210, a self-align etch (SAE) process is employed at step 212 to remove the first polysilicon layer and the overlying ONO layer in the regions between the desired word lines. Since the ONO fence is substantially vertical due to the substantially ideal anisotropic polysilicon etch profile formed at step 208, the ONO fence does not substantially shield any polysilicon. Consequently, the second portion of the SAE removes the polysilicon without any poly stringers left behind. After the SAE of step 212 the word lines are fully defined. Subsequent processing is then performed to form the source and drain regions in the substrate at step 214 as is well known by those skilled in the art.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of preventing poly stringers in the formation of a memory device, comprising the steps of:

forming at least one field oxide region in a substrate;

forming a tunnel oxide over the substrate;

forming a first polysilicon layer over the tunnel oxide;

forming a poly mask having a mask profile over the first polysilicon layer;

etching the first polysilicon layer in portions exposed by the poly mask, thereby creating a first polysilicon layer etch profile, wherein the first polysilicon layer etch profile is substantially ideally anisotropic and independent of the mask profile;

forming an insulating layer over the etched first polysilicon layer and a conductive layer over the insulating layer;

etching portions of the conductive layer, thereby forming at least one word line;

etching the insulating layer in regions adjacent the at least one word line, thereby leaving a substantially vertical insulative fence along the first polysilicon layer etch profile; and etching the first polysilicon layer in regions adjacent the at least one word line, wherein the etching of the first polysilicon layer is substantially anisotropic and removes substantially all the polysilicon in regions adjacent the at least one word line, resulting in the prevention of poly stringers.

2. The method of claim 1, wherein forming the poly mask comprises the steps of:

depositing a masking layer over the first polysilicon layer; and etching the masking layer to form a pattern, thereby exposing portions of the first polysilicon layer to be etched and creating the mask profile.

3. The method of claim 1, wherein etching the first polysilicon layer comprises etching the first polysilicon layer with a polysilicon etch having a polysilicon-to-poly mask selectivity of at least about 4:1.

4. The method of claim 1, wherein etching the first polysilicon layer comprises etching the first polysilicon layer with $HBrCl_2$, wherein HBr has a flow rate of about 70 sccm and $Cl_2$ has a flow rate of about 30 sccm.

5. The method of claim 1, wherein etching the first polysilicon layer comprises etching the first polysilicon layer with $HBrCl_2HeO_2$, wherein HBr has a flow rate of about 50 sccm, $Cl_2$ has a flow rate of about 15 sccm, and $HeO_2$ has a flow rate of about 5 sccm.

6. The method of claim 5, wherein the $HBrCl_2HeO_2$ etch is performed in a chamber having a chamber pressure of about 60 mTorr and a plasma excitation power of about 220 W.

7. The method of claim 6, wherein a magnetic field within the chamber is about 100 Gauss.

8. The method of claim 1, wherein etching the first polysilicon layer comprises etching the first polysilicon layer with $HBrCl_2HeO_2$, wherein HBr has a flow rate of about 50 sccm, $Cl_2$ has a flow rate of about 15 sccm and $HeO_2$ has a flow rate of about 3 sccm.

9. The method of claim 8, wherein the $HBrCl_2HeO_2$ etch is preformed in a chamber having a chamber pressure of about 60 mTorr and a plasma excitation power of about 220 W.

10. The method of claim 1, wherein the step of forming the insulating layer comprises the steps of:

forming a first oxide layer;

forming a nitride layer over the first oxide layer; and forming a second oxide layer over the nitride layer.

11. The method of claim 1, wherein the step of forming the conductive layer comprises depositing a polycrystalline silicon layer and doping the polycrystalline silicon layer with impurity ions.

12. The method of claim 11, wherein forming the conductive layer further comprises:

depositing a metal layer over the polycrystalline silicon layer; and performing a thermal treatment, thereby causing the metal layer and the polycrystalline silicon layer to react at an interface of the two layers, thereby forming a silicide.

* * * * *

UNITED STATES PATENT AND TRADEMARK OFFICE
CERTIFICATE OF CORRECTION

PATENT NO.: 6,046,085

DATED: April 4, 2000

INVENTOR(S): Maria Chow Chan

It is certified that error appears in the above-identified patent and that said Letters Patent is hereby corrected as shown below:

Column 9, line 15, please replace the numeral "10" with the numeral --110--.

Column 9, line 21, please replace the numeral "10" with the numeral --110--.

Column 9, line 62, please replace the figure numeral "91" with --9*l*--.

Signed and Sealed this

Sixth Day of February, 2001

*Attest:*

Q. TODD DICKINSON

*Attesting Officer*      *Director of Patents and Trademarks*